United States Patent
Caldara et al.

(10) Patent No.: US 6,748,474 B1
(45) Date of Patent: Jun. 8, 2004

(54) MIDPLANE APPARATUS

(75) Inventors: Stephen A. Caldara, Sudbury, MA (US); John St. Amand, Marlboro, MA (US); John Hutchins, Groton, MA (US); George Giordano, Acton, MA (US)

(73) Assignee: Telica, Inc., Marlboro, MA (US)

( * ) Notice: Subject to any disclaimer, the term of this patent is extended or adjusted under 35 U.S.C. 154(b) by 514 days.

(21) Appl. No.: 09/792,015

(22) Filed: Feb. 22, 2001

Related U.S. Application Data

(60) Provisional application No. 60/185,012, filed on Feb. 25, 2000.

(51) Int. Cl.⁷ .............................. G06F 13/00; H05K 7/10
(52) U.S. Cl. ............................... 710/301; 714/1; 714/2; 714/3; 714/4; 714/5; 714/6; 361/600; 361/679
(58) Field of Search .................. 710/301; 714/1–6; 361/600, 679

(56) References Cited

U.S. PATENT DOCUMENTS

| | | | | |
|---|---|---|---|---|
| 4,984,240 A | * | 1/1991 | Keren-Zvi et al. ............. | 714/4 |
| 5,036,473 A | | 7/1991 | Butts et al. | |
| 5,202,822 A | * | 4/1993 | McLaughlin et al. .......... | 700/82 |
| 5,352,123 A | | 10/1994 | Sample et al. | |
| 5,790,518 A | | 8/1998 | Nguyen et al. | |
| 5,887,158 A | | 3/1999 | Sample et al. | |
| 5,923,643 A | * | 7/1999 | Higgins et al. ............. | 370/218 |
| 5,953,314 A | * | 9/1999 | Ganmukhi et al. ......... | 370/220 |
| 6,097,303 A | * | 8/2000 | Lunz et al. .................. | 340/825 |
| 6,175,490 B1 | * | 1/2001 | Papa et al. .................. | 361/686 |
| 6,487,624 B1 | * | 11/2002 | Erickson et al. ............ | 710/302 |
| 2003/0041204 A1 | * | 2/2003 | Sanders et al. ............. | 710/301 |

FOREIGN PATENT DOCUMENTS

| | | | | |
|---|---|---|---|---|
| EP | 886219 A2 | * | 12/1998 | .......... G06F/13/40 |
| JP | 2000049732 A | * | 2/2000 | .............. H04J/3/00 |
| JP | 2000261871 A | * | 9/2000 | ........... H04Q/11/04 |

OTHER PUBLICATIONS

Bellamy, J.C., "Digital Network Synchronization," Apr. 1995, IEEE, Communications Magazine, vol. 33, Issue 4, p. 70–83.*

Blackmon, Harry C., "The DS3 Electronic Digital Signal Cross–Connect: Architecture and SONET Migration," Nov. 15–16, 1989 IEEE, SONET Symposium, p. 105–115.*

Hearst, S., "Intelligent Multiplexers with Digital CrossConnect Capability—A Requirement in Network Evolution," Nov. 27–30, 1989, IEEE, Global Telecomunications Conference and Exhibition: Communications Technology for the 1990s and Beyond, p. 527–532.*

Doherty, D.K., et al., "High Capacity Digital Network Management and Control," Dec. 2–5, 1990, IEEE, Global Telecommunications Conference and Exhibition: Communications: Connecting the Future, p. 60–64.*

Website (www.rad.com/networks/1994/gibran/atm_swi), Biran, Giora, "Introduction to ATM Switching", pp. 1–10, .printed Dec. 28, 2000.

(List continued on next page.)

*Primary Examiner*—Xuan M. Thai
*Assistant Examiner*—Donna K. Mason
(74) *Attorney, Agent, or Firm*—Hale and Dorr LLP

(57) ABSTRACT

A chassis, in the form of a midplane design holds equipment that provides communication services. The midplane design enables cables to be attached to modules secured to the back of the midplane. The rear modules have a minimum of circuitry so as to render them the least likely to fail. The front modules house the majority of the electronics. The rear modules can route the interface signals to a card in the adjacent front slot, directly through the midplane.

26 Claims, 8 Drawing Sheets

OTHER PUBLICATIONS

Website (www.networkmagazine.com/article/NMG20000727S00) Network Magazine.com, Steinke, Steve, "ATM Basics", May 1, 1995; pp. 1–3, printed Dec. 28, 2000.

Website (www.ind.alcatel.com/library/whitepapers/omnicore) Alcatel, OmniCore 5000 Enterprise Routing Switch Architecture, pp. 1–14, printed Feb. 8, 2001.

Website (www.net.com/products/narrowband/repository/product_guides/promina4000/pdf/p4kprodguide.pdf), Network Equipment Technologies, Promina 4000 ATM Switch Product Guide, , pp. 1–24.

Website (www.unispheresolutions.com) Unisphere Solutions, Service Mediation Swtich, SMX–2100, Data Sheet, pp. 1–4.

Website (www.cisco.com/univercd/cc/td/doc/cisintwk/ito_doc/atm), "Asynchronous Transfer Mode (ATM) Switching", Cisco System, Inc. pp. 1–19, posted Jun. 17, 1999, printed Dec. 28, 2000.

Website www.chipcenter,com/analog/tn024), Baker, Bonnie, "12–Bit Analog Layout Techniques" pp. 1–9, printed Dec. 27, 2000.

Website (Ic.cray.com/apps/svia), "Frequency Domain Analysis of a PCT VIA", pp. 1–13, printed Dec. 27, 2000.

Website, (www–ese.fingalgov/eseproj/svx/j3_bkpln/gen_j3), Fermi National Accelerator Laboratory, Anderson, John T.

* cited by examiner

CPU/TIMING- SLOTS 9, 13

MIDPLANE APPARATUS

RELATED APPLICATION

This application claims priority from U.S. provisional application serial No. 60/185012 filed on Feb. 25, 2000 and entitled "Chassis Interconnect System and Method", the details of which are hereby incorporated by reference.

DESCRIPTION

BACKGROUND OF THE INVENTION

1. Field of the Invention

The present invention relates generally to a communication apparatus and method of operation thereof and, more particularly, to a communication apparatus that comprises a set of interconnects in a chassis, embodied by a mid-plane, that achieves communication density and high availability goals by providing multiple types of redundancy along with the ability to add/remove modules without having to restart the system.

2. Background Description

Computer and communication systems typically use a multitude of modules (e.g., printed circuit boards with electrical components) that can be inserted into and extracted from a chassis to support a large number of interfaces. Without proper support, these modules cannot be dynamically added or removed because the insertion/removal corrupts a shared resource, such as power or a communication bus. Hence, high availability goals (service disruption measured in seconds per year) cannot generally be achieved.

To achieve high-availability, card redundancy is typically employed in order to allow services to be provided by one card while the other is being serviced either due to a fault or a capability upgrade. Card redundancy can be employed on either a central controlling card, interface modules, or both.

There are two types of redundancy: one-to-one (1:1) redundancy, and N-to-one (N:1) redundancy. 1:1 redundancy is characterized where there is a "working" (i.e., active) unit and a "protection" (i.e., standby) unit in a one to one relationship. If the working unit is removed from service, either due, for example, to a failure or a maintenance operation, then the protection unit takes over. N:1 redundancy is characterized where N units are working, and they are backed up by a single protection card. N:1 redundancy are typically more cost effective.

Interconnect is crucial to supporting redundancy because more than one card may have to be switched into and out of the service providing path. The external interface generally needs to be able to be driven from more than one card in order to achieve this switching function. Furthermore, if there are different interface types, then there needs to be a interconnect network for each interface type that operates with redundancy.

Also, to achieve high availability, faults have to be detected and isolated. One method for achieving isolation is to have separate circuits for each card. However, if these circuits are in the form of a multi-bit bus, then a large number of connector pins is used by central controlling card, which is not only costly, but can increase the probability of failure.

SUMMARY OF THE INVENTION

It is a feature and advantage of the present invention to provide a communication apparatus, embodied by a midplane, that achieves communication density and high availability goals by providing multiple types of redundancy along with the ability to add/remove modules without having to restart the system.

It is another feature and advantage of the present invention to allow modules to be dynamically added or removed to/from the midplane.

It is yet another feature and advantage of the present invention to provide a midplane apparatus that has an improved availability.

To achieve these features and advantages, the invention is an interconnect system that supports a combination of 1:1 system processor redundancy with redundant/isolated communication paths between them, 1:1 timing source redundancy, 1:1 high speed internal communication redundancy, and support for two or more N:1 redundant external interfaces. Lastly, to achieve density, high frequency communication is employed. High frequency communications requires careful routing and isolation techniques to ensure proper interference-free operation.

A chassis, in the form of a midplane design (i.e., the circuit modules plug in from both the front and the rear of the midplane), is used to hold equipment that provides communication services. In one embodiment, the midplane design enables cables to be attached to modules which, in turn, are secured to the back of the midplane. The rear modules preferably have a minimum of circuitry so as to render them the least likely to fail, and can be replaced in the event that they do fail. The front modules house the majority of the electronics. In operation, the rear modules route the interface signals to a card in the adjacent front slot, directly through the midplane. The design in accordance with the present invention advantageously enables the rear modules to stay in place while a front module is replaced for servicing. Thus, if a front module (i.e., interface electronics) needs to be replaced, the cables do not have to be detached and reattached to the rear module. Nor do the rear modules generally need to be detached from the midplane. The components and cables on the rear are thus rarely altered, with one obvious exception being the installation of new cables. Hence, servicing is generally performed from the front of the chassis.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there is illustrated preferred embodiments of the invention.

BRIEF DESCRIPTION OF THE DRAWINGS

The Detailed Description including the description of a preferred structure as embodying features of the invention will be best understood when read in reference to the accompanying figures wherein.

DETAILED DESCRIPTION OF A PREFERRED EMBODIMENT OF THE INVENTION

Figure 1:
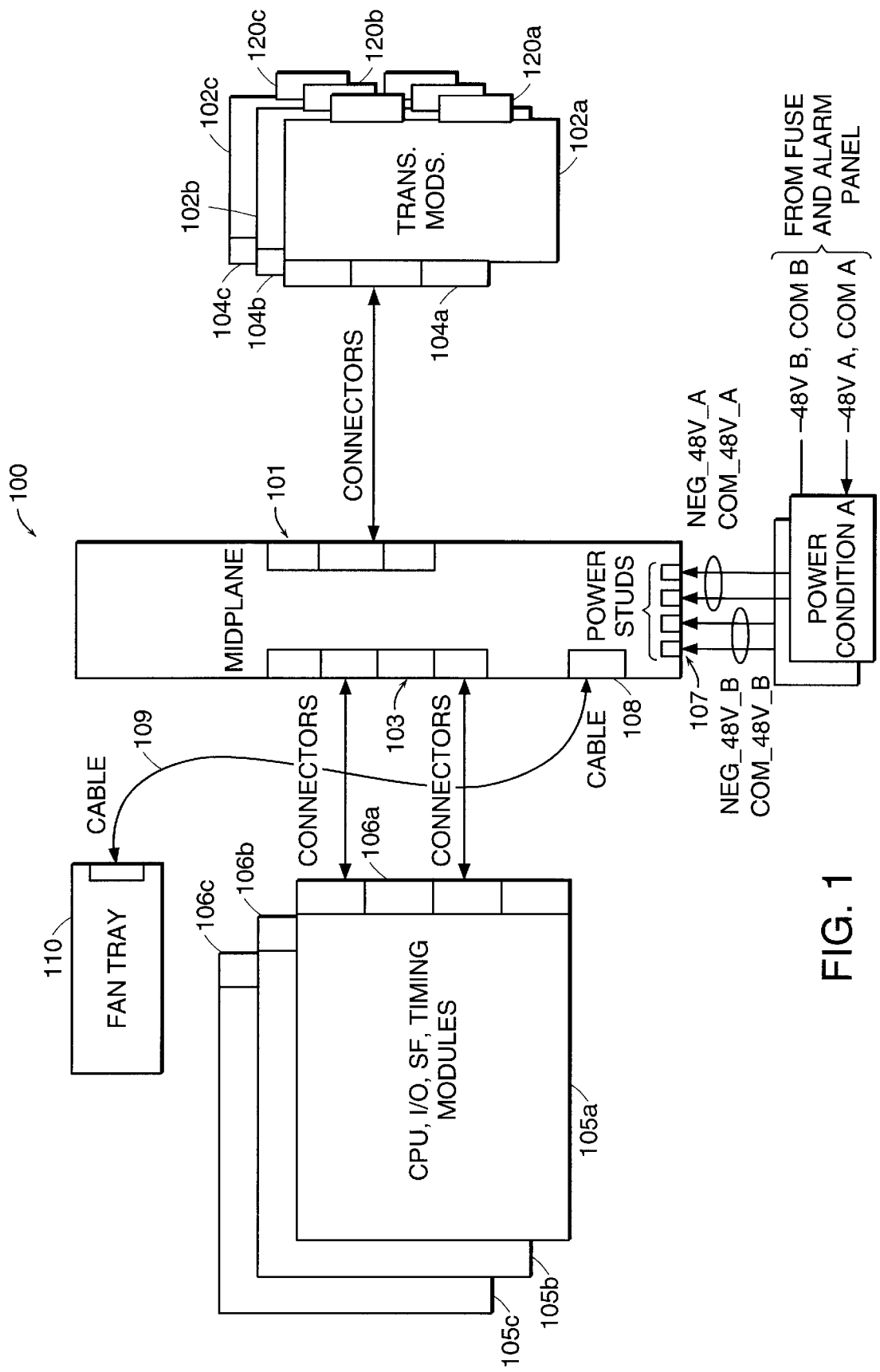
FIG. 1 is a schematically simplified representation of the overall midplane, front module, and rear module system interconnects.
Figures 2, 3:
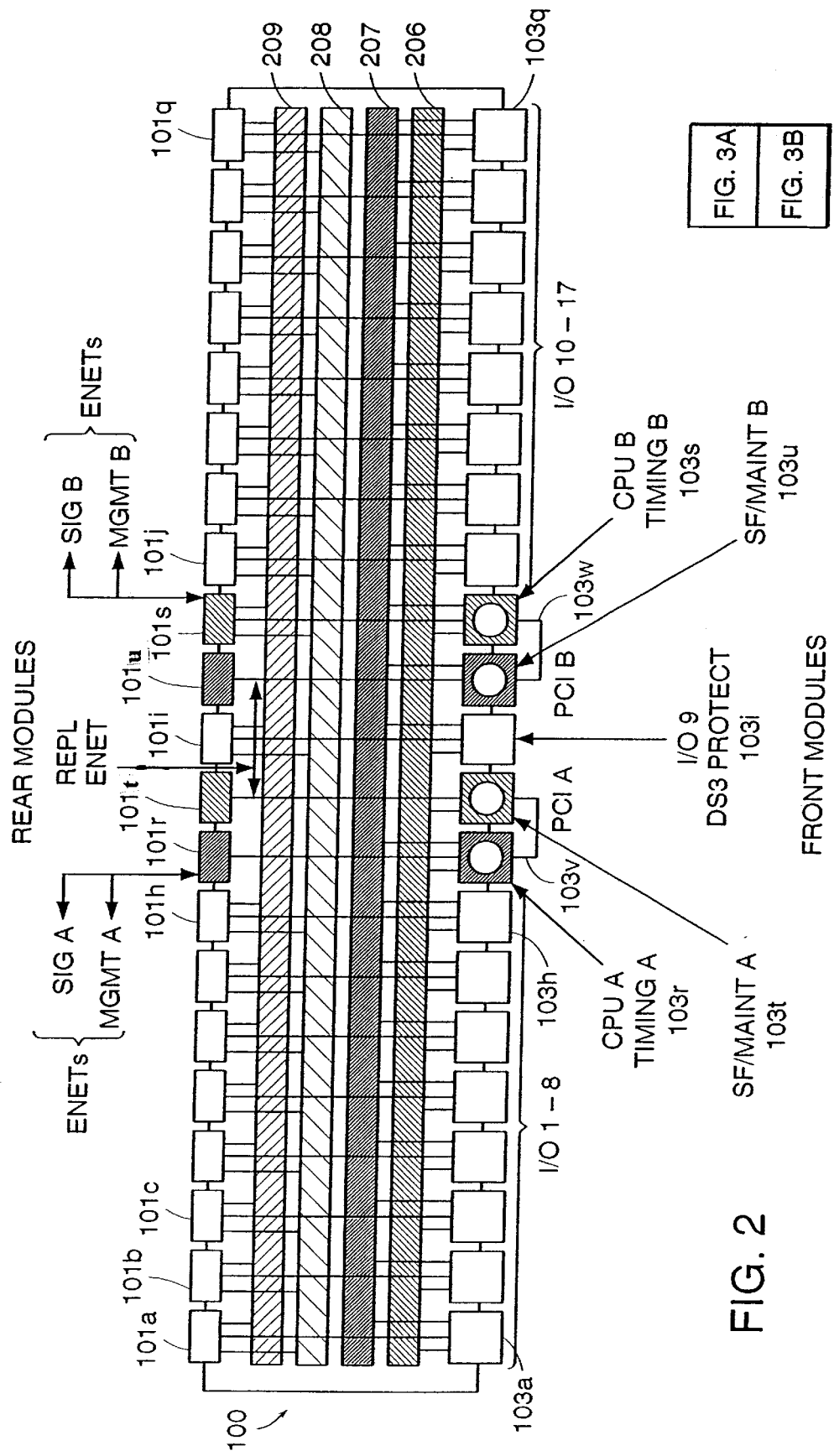
FIG. 2 is a schematically simplified representation of the positions of equipment slots/connectors on the midplane.
FIG. 3 is a simplified front view of the midplane connector layout.
Figure 3A:
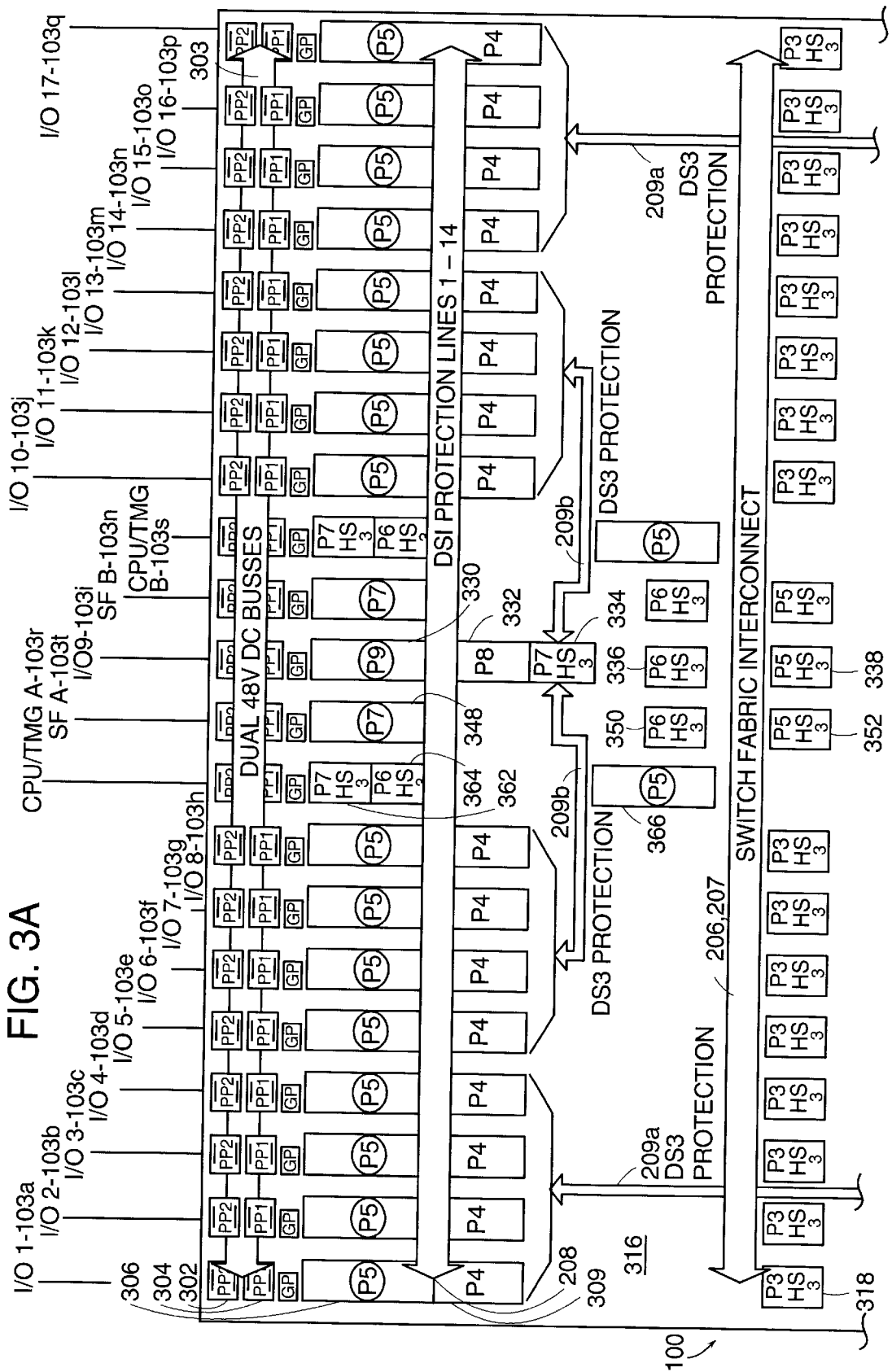
Figure 3B:
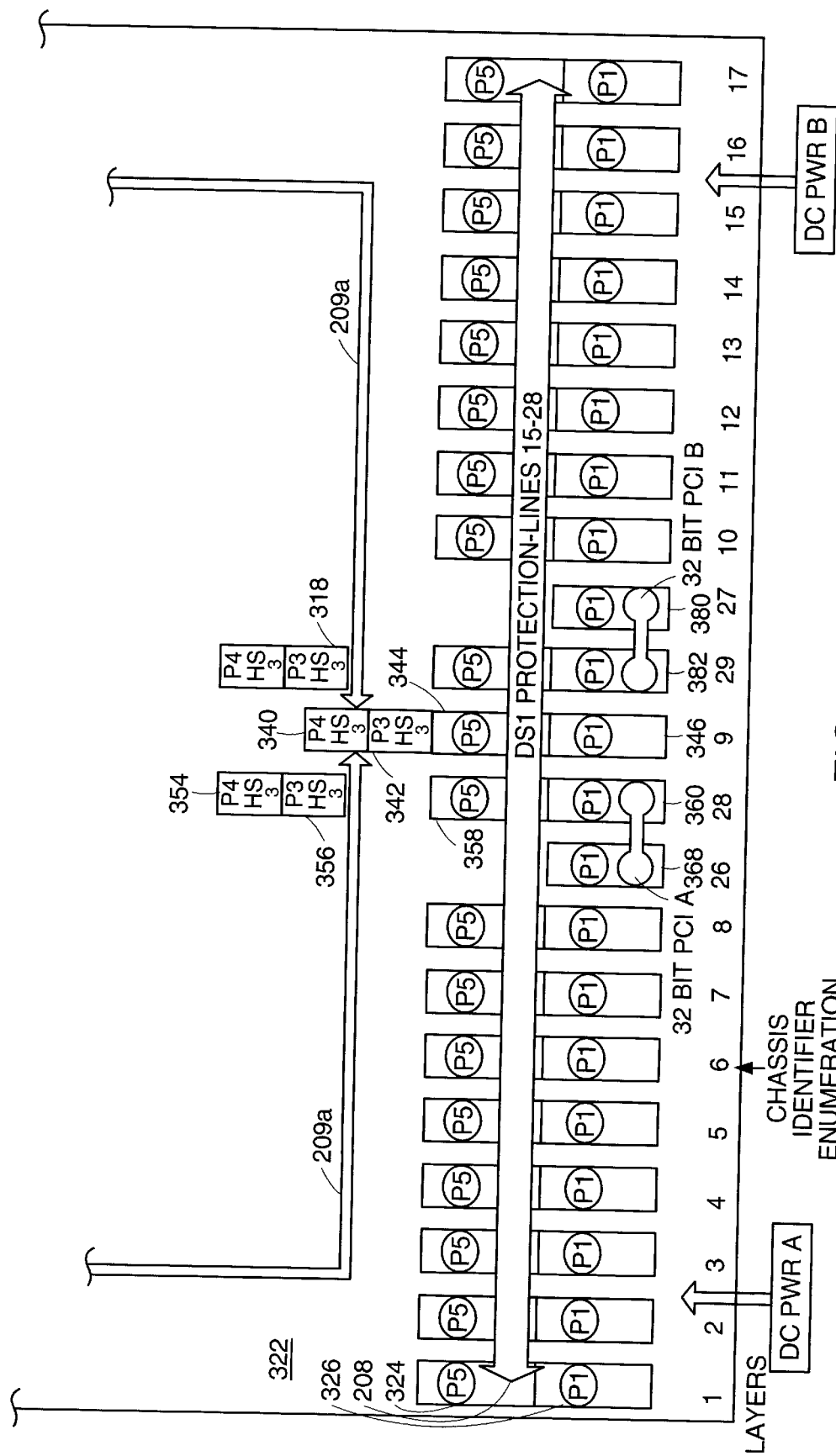

Turning now to the drawings, FIG. 1 is a schematically simplified drawing showing how the midplane 100, which is preferably a printed circuit board (PCB), has connectors 101, 103, positioned on opposing sides thereof. As shown, connectors 101 are thus preferably located on one side of the midplane 100, and connectors 103 are located on an opposing side of the midplane 100. The connectors 101, 103 preferably comprise a plurality of conventional pins (i.e., male leads). Rear modules 102a, 102b, 102c plug into the back of the midplane 100 using, for example, connectors 104a, 104b, 104c. Additional modules that comprise the system are shown in FIGS. 2 and 3. The connectors 104a, 104b, 104c preferably comprise a plurality of receptacles fabricated to align and mate with the corresponding pins of the respective midplane connectors (e.g., 101a, 101b 101c, (not shown)). Cables (not shown) are attached to cable connectors 120a, 120b, 120c, which are preferably located on a side of the rear modules 102a, 102b, 102c opposite connectors 104a, 104b, 104c, respectively. The front modules, 105a, 105b, 105c preferably have a majority of the active electronic components. As such, these modules are more likely to need replacement either for failures or upgrades. Preferably, modules 105a, 105b, 105c do not have any connectors other than their respective midplane connectors 106a, 106b, 106c, which advantageously enables them to be extracted from the midplane 100 without, for example, unplugging, tracking, and replugging cabling.

The midplane 100 can distribute utility functions, such as power via power connectors 107, and fan controls via connector 108. A cable 109 can be routed between the connector 108 and fan tray 110.

As previously noted, the midplane connectors 101, 103 are preferably comprised of a plurality/array of pins, whereas the connectors on the front modules 105a, 105b, 105c, etc. and rear modules 102a, 102b, 102c, etc. that plug into the midplane 100 are preferably comprised of a correspondingly matching plurality/array of receptacles. This connectivity advantageously enables the pins to pass directly through the midplane 100 and provide connectivity from the front modules 105a, 105b, 105c to the corresponding/respective rear modules 102a, 102b, 102c without any etch on the midplane 100.

FIG. 2 shows a schematically simplified side view of one embodiment of a midplane 100 connector placement. The shown orientation of the midplane 100 is such that the rear Input/Output (I/O) modules 102a, 102b, 102c, and also rear I/O modules 102d–q, are placed on the top of the midplane, correspondingly into connectors 101a–101q. Similarly, front I/O modules 105a, 105b, 105c, and 105d–q, are placed on the bottom of the midplane 100, correspondingly into I/O connectors 103a–q. As such, the shown embodiment has 17 rear module I/O connectors (i.e., connectors 101a–q), and 17 front module I/O connectors (i.e., connectors 103a–q).

Also shown on FIG. 2 are two (2) connectors 101r, 101s for a central processing unit (CPU), system processor, or equivalent, and two (2) corresponding rear module connectors 103r, 103s. In addition, two (2) front module connectors 101t, 101u are provided for a ATM switch fabric (SF), and two (2) corresponding rear module connectors 103t, 103u. The CPUs that plug into connectors 103r, 103s also preferably provide system clock generation, whereas the ATM SF modules 105t, 105u that plug into connectors 103t, 103u preferably provide maintenance operations such as, for example, module presence and utility module control functions.

The center rear I/O connector 101i has additional connectors, relative to connectors 101a–q, whose pins have signal traces 209 which are radially connected to the rear connectors 101a–q. The rear module connectors 104a–q have the capability of routing the I/O signals to either the corresponding connector pins associated with the respective corresponding front module connectors 106a–q, or to the pins that are connected to the center connector 101i. The rear module 102i that plugs into connector 101i can select one of N of these signals and connect it to the front connector 103i. This advantageously allows the module plugged into front connector 103i to substitute for any of the modules (i.e., 105a–q) in the midplane 100. The center connector 101i is preferably utilized in order to balance the radial etch that leads from connectors 101a–h and 101j–3q.

Connectors 103t, 103u also have signal traces 206, 207, respectively, that are radially interconnected to connectors 103a–q. Signals, preferably via trace 206, can go from each connector 103a–q to connector 103t. Similarly, signals, preferably via trace 207, can go from connectors 103a–q to connector 103u. These connectors 103t, 103u are located next to the center connector 103i in order to balance the etch lengths from all the connectors (i.e., connectors 103a–q). The CPU modules (i.e., 105r, 105s) that plug into connectors 103r, 103s are preferably positioned adjacent connectors 103t, 103u, respectively, in order to minimize the length of the respective Peripheral Component Interconnect (PCI) buses 103v, 103w therebetween.

There is also a bus 208, to which each of the rear I/O connectors 101a–q are connected to. The rear I/O modules 102a–q have the capability of routing the I/O signals, via connectors 101a–q, to either the respective front connector 103a–q pins, or to bus 208 on the midplane 100. A special rear module can be plugged into any of connectors 101a–q, which can route the signals on bus 208 through to its associated front connector (e.g., 101a to 103a, 101b to 103b, etc.). This advantageously allows the module plugged into front connector associated with this special rear module to substitute for any of the cards in the system. The signals on bus 208 are preferably of a lower frequency than signals on protection network 209, and hence can tolerate a bus instead of point-to-point topology.

FIG. 3 shows the front of a representative midplane 100 layout of the respective P1 (326), P2 (324), P3 (318), P4 (309), and P5 (306) connectors of the I/O connectors 103a–q, the redundant CPU/Timing connectors 103r, 103s, and the redundant SF modules 103t, 103u. At least one of each type of module (i.e., at least one of an I/O module 105a–q, at least one CPU module 105t, 105u, and at least one a SF module 105t, 105u) must be present in order to have a functioning system. The placement of connectors 103a–u and their associated signals is critical to the density, cost and functionality of the midplane 100 and associated equipment operatively connected thereto. The following paragraphs describe each connection on an I/O Module (generally from top to bottom) and explain the benefit of the placement.

I/O Connectors

I/O connectors 103a–q have power connectors 302, 304, preferably carrying DC power, are preferably positioned at or near the top of the midplane 100 so as to enable the heat generated by the power converters (not shown) to rise and thus not effect or minimize the effect on other components. The power converters can be positioned adjacent to the power connectors to minimize etch length and any noise coupling and voltage loss associated therewith. P5 connectors 306 have half (or approximately half) of the rear-to-front I/O communication pins, and also have digital signal 1 (DS1) protection bus 208 pins. Circuit board routing congestion around connectors 306, 309 is avoided by distributing the signals between multiple connectors (306, 309, 324, 326). The DS1 protection bus 208 has many (e.g., fifty-six) connections, and each P5 connector preferably has 28 pins that are bussed along the midplane 100. A different number of pins can also be used to suit a particular application or purpose.

The P4 connectors 309 comprise pins for both the DS1 protection bus 208 and DS3 network 209a, 209b. The DS3 network 209a, 209b preferably has fewer, and higher speed, connections that are preferably routed radially (i.e., point-to-point) to the central connector 103i for signal integrity reasons. Below the P4 connectors 309 is a space 316 for routing the DS3 network 209b.

The P3 connectors 318 contain pins for the SF interconnect 206, 207. These connection are preferably routed radially from each interface module 103a–q to each of SF connectors 103t, 103u. Space 322 is provided for routing these radial signals.

The P2 connectors 324 provide the balance of the front-to-rear I/O pins and DS1 protection bus 208 pins. The P1 connectors 326 provide maintenance functions for slots 103a–103q, whereas P1 connectors 360, 328 and 380, 382 respectively serve as a compact PCI bus connector. In a preferred embodiment, four connectors 306, 309, 324, and 326 are utilized to provide the connector pins for the DS1 signals.

The P1 connector etches are preferably routed radially from each interface connector 103a–q to the SF connectors 103t, 103u. The P1 connectors 326 also preferably house at least one connector pin that controls whether the corresponding rear module should source its signals to the corresponding front module or to the midplane 100. The control signals originate from the SF connectors 103t, 103u. These control signals are routed radially, in that there are two etches from each of the SF modules 103t, 103u to each rear module 102a–q.

With regard to center I/O module 103i, the P9 connector 330 pins and P8 connector 332 pins provide DS1 protection and I/O. The P7 connector 334 pins and P6 connector 336 pins provide interconnect protection for the DS3 network 209b. The P5 connector 338 pins provide connect to the SF interconnect 206, 207, whereas the P4 connector 340 pins and the P3 connector 342 pins are for DS3 209a network. The P2 connector 344 pins are for the DS1 protection bus 208, and the P1 connector 346 pins are for maintenance.

Switch Fabric Modules

The P7 connector 348 for the SF modules 105t, 105u perform maintenance functions. Each of the P6 (350), P5 (352), P4 (354) and P3 (356) connector pins are for the SF interconnect 206, 207. The P2 connectors 358 are for maintenance, and the P1 connectors 360 are for the PCI busses 103v, 103w.

CPU/Timing Modules

The P7 connector 362 for the CPU/Timing modules 103r, 103s contains the primary system clock. The P6 connector 364 contains the system wide frame synchronization signal, which is used by the I/O modules 105a–q to align themselves with respect to the system clock cycle timing and system frame timing. The P5 connector 366 provides a common CPU I/O, and the P1 connector 368 connects to the respective PCI busses 103v, 103w.

I/O Module Connections

Figure 4:
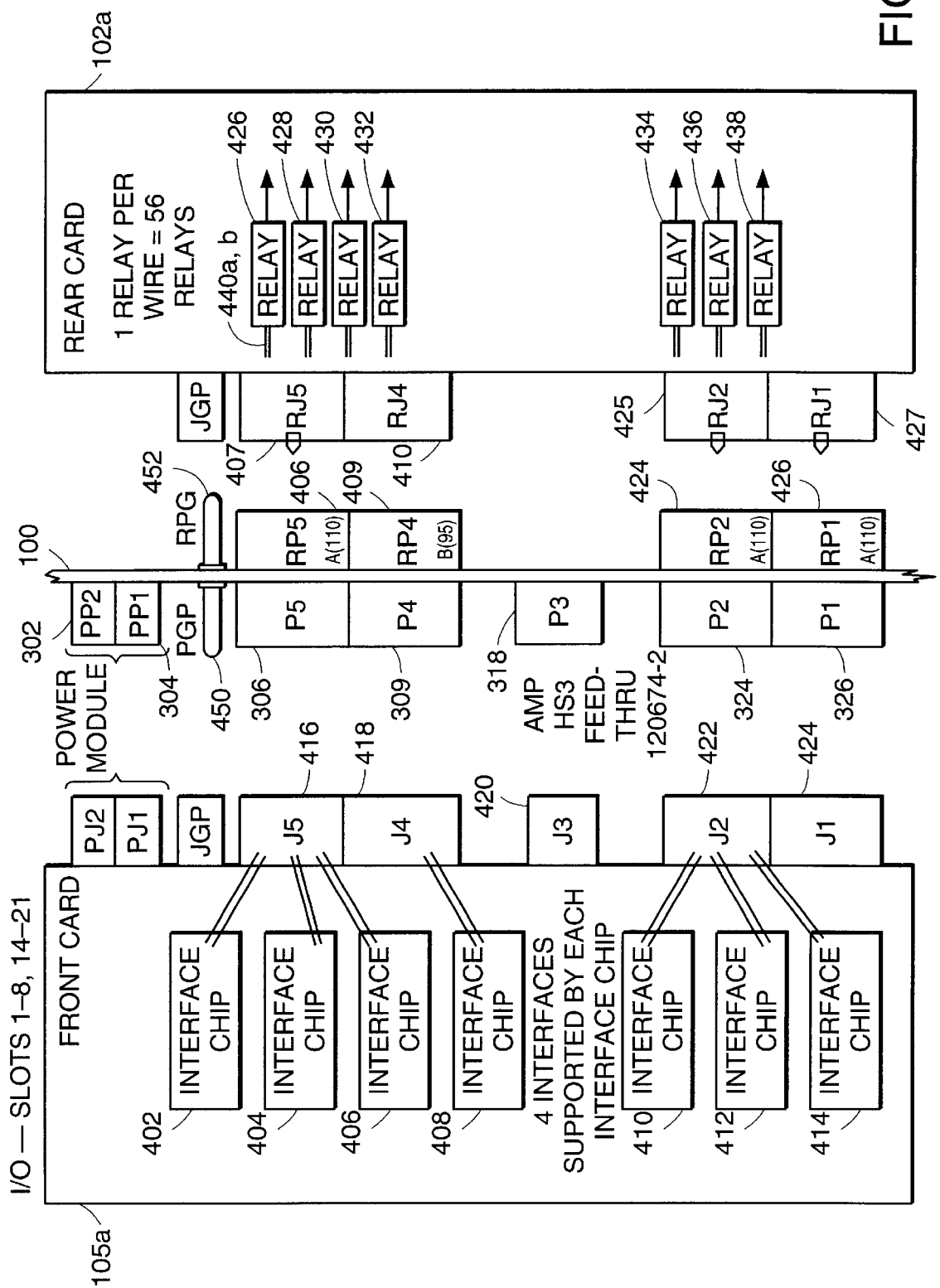
FIG. 4 is a schematically simplified representation of the connections between the front I/O modules, their corresponding rear modules, and the midplane.

FIG. 4 shows the connector assignments of front modules 105a–q to the midplane 100, and the connector assignments of rear modules 102a–q to the midplane 100. Interface chips 402, 404, 406, 408 are placed on upper portions of the front modules 105a–q closer to the DS1 signals sent on the P5 connectors 306 and some of the P4 connectors 309. Analogously, interface chips 5–7 (410, 412, 414) functions are physically placed on the lower portion of the front modules 105a–q closer to the other DS1 signals received from the P2 (324) and P1 (326) connectors. Spacing the first DS1 protection bus 208 and the second DS1 protection bus 208, as shown in FIG. 3, relieves component congestion on the front modules 105a–q, and facilitates the placement of the front modules 105a–q to minimize signal lengths thereon and thus better preserve signal integrity.

The relays 426–438 shown on the rear module 102a (which are also provided on rear modules 105b–q) are used in connecting protection modules in case an existing module needs to be replaced or upgraded. A special rear module (not shown) can be used as a protection module. This protection rear module connects the DS1 protection bus 208 to the front modules 105b–q The protection rear module can be used in any I/O slot 103a–q. The front module (e.g., 105h) that is in the same slot as the protection rear module (e.g., 102h) is considered the protection module. It can take over the services for any of the other modules (e.g., 105a–g, 105i–q) when the relays for the other module is switched. In a preferred embodiment, one rear protection module is provided for the DS1 protection bus 208. Preferably, adjacent pins (e.g., 440a, 440b) of each respective relay 426–438 are used to form a pair, in which one pin is used to send a signal to the corresponding front module (e.g., 105a) and another pin is used to carry the same signal to the DS1 protection bus 208. The relays 426–438 may be programmatically controlled to switch thus causing the signal to be sent on to the DS1 protection bus 208 (where it will then be received by a protection module) rather than to send the signal to the front module. The midplane also has rear connectors 406, 409, 424, 426 that connect to rear module connectors 407, 410, 426 and 427, respectively. Ground protection 450, 452 is also provided.

Figure 5:
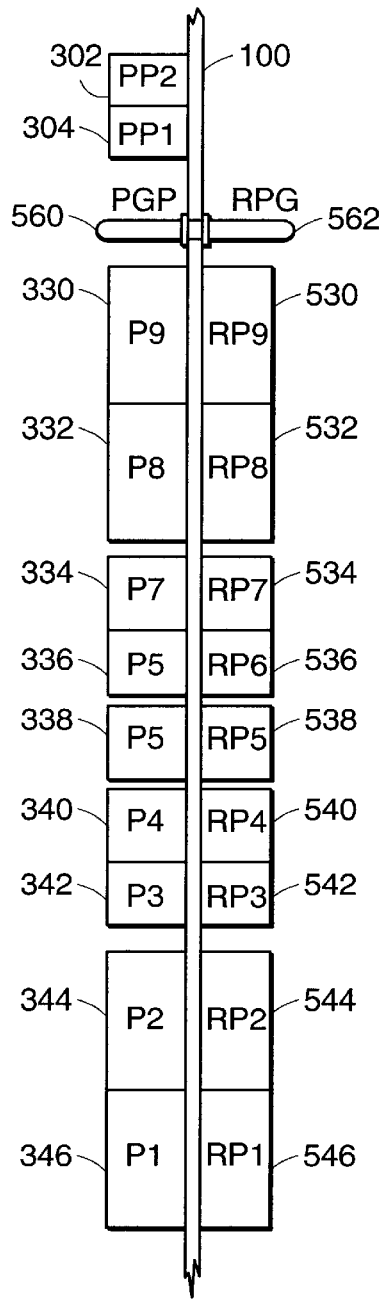
FIG. 5 is a schematically simplified representation of the combined center I/O and DS-3 midplane connectors.

FIG. 5 shows the connector assignments of front module 105i, corresponding to connector 103i. Power connectors 302 and 304 are shown, as are the P9 330, P8 332, P7 334, P6 336, P5 338, P4 340, P3 342, P2 344, and P1 346 connectors. The connectors 530–546 for the rear of the midplane are also shown. Ground protection 560, 562 is also provided.

Figure 6:
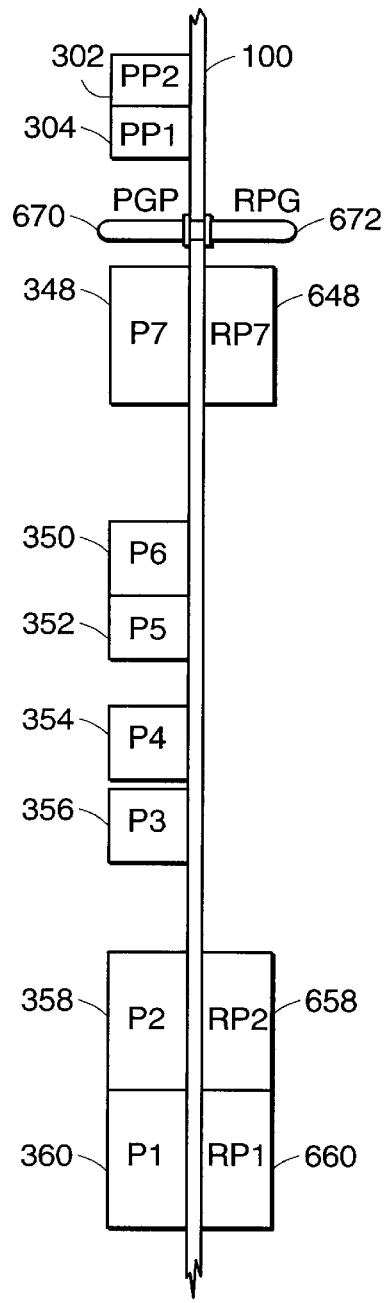
FIG. 6 is a schematically simplified representation of the switch fabric midplane connectors.

FIG. 6 shows the connector assignments of SF modules 105t, 105u, corresponding to connectors 103t, 103u, respectively. Power connectors 302 and 304 are shown, as are the P7 348, P6 350, P5 352, P4 354, P3 356, P2 358, and P1 360 connectors. The connectors 648, 530–546 for the rear of the midplane are also shown. Ground protection 670, 672 is also provided.

Figure 7:
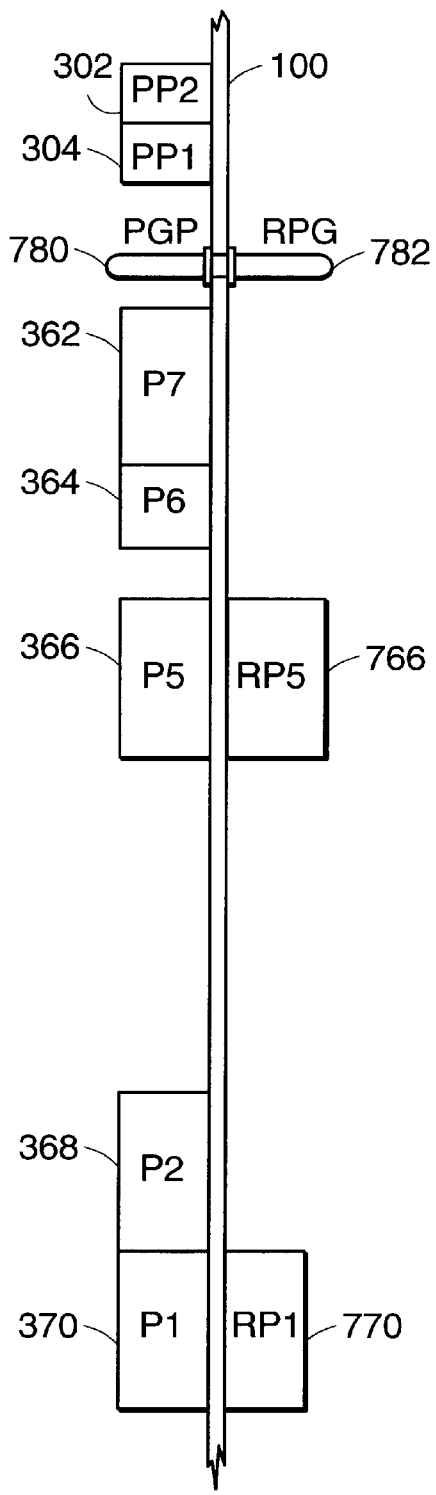
FIG. 7 is a schematically simplified representation of the CPU/Timing midplane connectors.

FIG. 7 shows the connector assignments of CPU/Timing modules 105r, 105s, corresponding to connectors 103r, 103s, respectively. Power connectors 302 and 304 are shown, as are the P7 362, P6 364, P5 366, P2 368, P1 370 connectors. The connectors 766 and 770 for the rear of the midplane are also shown. Ground protection 780, 782 is also provided.

Figure 8:
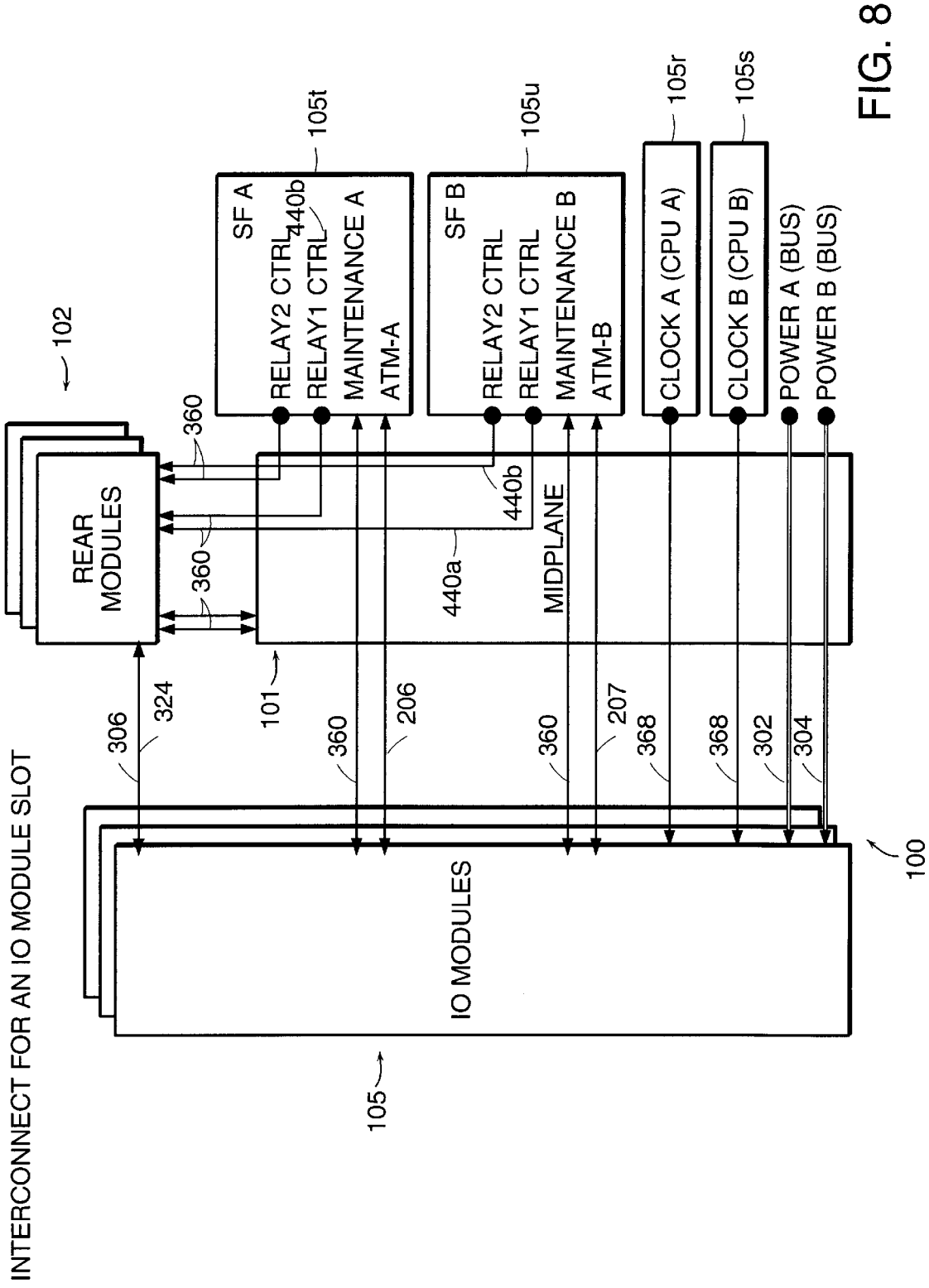
FIG. 8 is a schematically simplified logical representation of an interconnect for an I/O module slot.

FIG. 8 shows the logical connections between the front modules 105, the rear modules 102, the midplane 100, the redundant SF modules 103t, 103u, and the redundant CPU/Timing modules 103r, 103s. Power connectors 302, 304, preferably carrying DC power, are at or near the top of the midplane 100, and are connected to each module 105a–u. As previously discussed, CPU/Timing modules 105r, 105s have a clock that generates a signal that is provided to each of front modules 105a–q, preferably via respective P1 connectors 368. SF modules 105t, 105u are also shown. The respective P1 connectors 360 for modules 105t, 105u provide the relay 1, relay 2 and maintenance functions, whereas the SF interconnect 206, 207 is provided by the respective P6 (350), P5, (352), P4 (354) and P3 (356) connectors. The rear module 102a–q to front module 1015a–q connections are provided by the P5 (306) and P2 (324) connectors, respectively.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention. While the foregoing invention has been described in detail by way of illustration and example of preferred embodiments, numerous modifications, substitutions, and alterations are possible without departing from the scope of the invention defined in the following claims.

Having thus described our invention, what we claim as new and desire to secure by letters patent is as follows:

1. An electronic midplane assembly comprising:
   a plurality of front module slots on a first side of the assembly, and a plurality of corresponding rear module slots on a second side of the assembly, said front modules slots comprising a plurality of input/output (I/O) slots, a plurality of central processing unit (CPU)/Timing slots, a plurality of switching fabric (SF) slots, and a centrally located I/O slot;
   a first and second set of DC power pins for each of said front module slots for providing power thereto;
   for each of said plurality of I/O slots, a first and a second set of DS1 pins providing electrical communication from an I/O module to a corresponding rear module slot;
   for each of said plurality of I/O slots, a set of SF interconnect pins providing electrical communication to a set of SF traces that are in electrical communication with the SF slots;
   for each of said plurality of I/O slots, a set of DS3 pins providing electrical communication from the I/O module to the corresponding rear modules, the set of DS3 pins being located between said first and second sets of DS1 pins;
   a DS1 signal protection bus substantially spanning the length of the midplane assembly and separated into a first trace set in relay-controlled electrical communication with said first set of DS1 pins, and a second trace set in relay-controlled, electrical communication with said second set of DS1 pins;
   at least one DS3 signal protection bus having a first portion located below a vertical centerline of the midplane assembly and spanning from a first set of the module slots positioned nearer left and right edges of the midplane, and a second portion located above a vertical centerline of the midplane assembly and spanning from a second set of module slots positioned at a relative interior of the first set of module slots, said at least one DS3 signal protection bus being in relay-controlled electrical communication with the DS3 pins; and
   a set of utility pins for each front module, the utility pins being located below said second set of DS1 pins.

2. The midplane assembly according to claim 1 wherein said DC power pins are located at a top portion of the midplane assembly.

3. The midplane assembly according to claim 1 wherein said first set of DS1 pins are located below said first and second set of DC power pins and in an upper vertical half portion of the midplane assembly.

4. The midplane assembly according to claim 1 wherein said second set of DS1 pins are located on a lower half vertical portion of the midplane assembly.

5. The midplane assembly according to claim 1 wherein said SF traces are located between said first set of DS1 pins and said second set of DS1 pins.

6. In a midplane assembly that supports a combination of 1:1 system processor redundancy, 1:1 timing source redundancy, 1:1 high speed internal communication redundancy, and support for at least two N:1 redundant external interfaces, and comprises: a plurality of front module slots on a first side of the assembly, and a plurality of corresponding rear module slots on a second side of the assembly, the front modules slots comprising a plurality of input/output (I/O) slots, a plurality of central processing unit (CPU)/Timing slots, a plurality of switching fabric (SF) slots, and a centrally located I/O slot; a first and second set of DC power pins for each of the front module slots for providing power thereto; for each of said plurality of I/O slots, a first and a second set of DS1 pins, a set of DS3 pins, and a set of SF pins; a DS1 signal protection bus substantially spanning the length of the midplane assembly and separated into a first trace set in relay-controlled electrical communication with said first set of DS1 pins, and a second trace set in relay-controlled electrical communication with said second set of DS1 pins; a DS3 signal protection bus having a first portion located below a vertical centerline of the midplane assembly and spanning from a first set of the I/O module slots positioned near left and right edges of the midplane assembly, and a second portion located above a vertical centerline of the midplane assembly and spanning from a second set of I/O module slots positioned at an interior relative to the first set of I/O module slots, the DS3 signal protection bus being in relay-controlled electrical communication with the set of DS3 pins; and a set of utility pins for each front module slot, an I/O module for the I/O slots comprising:

a first and a second DC power connector that receives the first and second set of DC power pins, respectively;

a combined DS1 and DS3 connector that receives the first set of DS1 pins and the set of DS3 pins;

a switch fabric connector that receives the switch fabric pins;

a DS1 connector located below a vertical centerline of the midplane assembly that receives the second set of DS1 pins; and a utility pin connector that receives the set of utility pins.

7. The I/O module according to claim 6 wherein said combined DS1 and DS3 connector is located above a vertical centerline of the midplane assembly.

8. The I/O module according to claim 6 wherein said DS1 connector is located below a vertical centerline of the midplane assembly.

9. The I/O module according to claim 6 wherein the switch fabric connector is positioned between said DS1 connector and said combined DS1 and DS3 connector.

10. The I/O module according to claim 6 wherein said switch fabric connector is positioned between the combined DS1 and DS3 connector and said DS1 connector.

11. The I/O module according to claim 6 wherein said switch fabric connector is located substantially near a vertical centerline of the I/O module.

12. In a midplane assembly that supports a combination of 1:1 system processor redundancy, 1:1 timing source redundancy, 1:1 high speed internal communication redundancy, and support for at least two N:1 redundant external interfaces, and comprises a plurality of front module slots on a first side of the assembly, and a plurality of corresponding rear module slots on a second side of the assembly, the front modules slots comprising a plurality of input/output (I/O) slots, a plurality of central processing unit (CPU)/Timing slots, a plurality of switching fabric (SF) slots, and a centrally located I/O slot; a first and second set of DC power pins for each of said front module slots for providing power thereto; for each I/O module slot, a first and a second set of DS1 pins, and a first and second set of DS3 pins, a set of switch fabric pins; a third and fourth set of DS3 pins, and a third set of DS1 pins; a DS1 signal protection bus substantially spanning the length of the midplane assembly and separated into a first trace set in relay-controlled electrical communication with the first and second set of DS1 pins, and a second trace set in relay-controlled electrical communication with the third set of DS1 pins; a DS3 signal protection bus having a first portion located below a vertical centerline of the midplane assembly and substantially spanning from a first set of the I/O module slots positioned near left and right edges of the midplane assembly, and a second portion located above a vertical centerline of the midplane assembly and substantially spanning from a second set of I/O module slots positioned at an interior relative to the first set of I/O module slots, the DS3 signal protection bus being in relay-controlled electrical communication with each of the first, second, third and fourth set of DS3 pins; and a set of utility pins for each front module slot, a rear center I/O module for a rear center I/O slot comprising:

a first and a second DC power connector that receives the first and second set of DC power pins, respectively;

a first DS1 connector and second DS1 connector located above a vertical centerline of the midplane assembly the first DS1 connector and the second DS1 connector receiving the first and second set of DS1 pins, respectively, the second DS1 connector being located below the first DS1 connector;

a first DS3 connector and second DS3 connector located above a vertical centerline of the midplane assembly the first DS3 connector and the second DS3 connector receiving the first and second set of DS3 pins, respectively;

a third DS1 connector located below a vertical centerline of the midplane assembly that receives the third set of DS1 pins;

a third DS3 connector and fourth DS3 connector located below a vertical centerline of the midplane assembly the third DS3 connector and the fourth DS3 connector receiving the third and fourth set of DS3 pins, respectively;

a switch fabric connector positioned between the second and third DS1 connectors that receives the switch fabric pins; and a utility pin connector that receives the set of utility pins.

13. The rear center I/O module according to claim 12 wherein said first and second DS1 connectors are located below said first and second DC power connectors.

14. The rear center I/O module according to claim 12 wherein said first and second DS3 connectors are located below at least one of said DS1 connectors.

15. The rear center I/O module according to claim 12 wherein said third and fourth DS3 connectors are located below said switch fabric connector.

16. The rear center I/O module according to claim 12 wherein said utility pin connector is located below said third DS1 connector.

17. In a midplane assembly that supports a combination of 1:1 system processor redundancy, 1:1 timing source redundancy, 1:1 high speed internal communication redundancy, and support for at least two N:1 redundant external interfaces, and comprises a plurality of front module slots on a first side of the assembly, and a plurality of corresponding rear module slots on a second side of the assembly, the front modules slots comprising a plurality of input/output (I/O) slots, a plurality of central processing unit (CPU)/Timing slots, a plurality of switching fabric (SF) slots, and a centrally located I/O slot; a first and second set of DC power pins for each of said front module slots for providing power thereto; for each of said plurality of SF slots, a first set of maintenance pins, a first, second, third, and fourth set of SF interconnect pins, a second set of maintenance pins, and a set of pins to electrically connect a SF slot to a CPU/Timing slot, a SF module for each of the SF slots comprising:

- a first and a second DC power connector that receive first and second set of DC power pins, respectively;
- a first maintenance connector that receives the first set of maintenance pins;
- a first, a second, a third and a fourth SF connectors that receive the first, second, third and fourth SF pins, respectively;
- a second maintenance connector that receives the second set of maintenance pins; and
- a connector to provide an electrical connection to CPU/Timing slot pins.

18. The SF module according to claim 17 wherein said first maintenance connector is located below said first and second DC power connectors.

19. The SF module according to claim 17 wherein said first, said second, said third and said fourth SF connectors are each located below said first maintenance connector.

20. The SF module according to claim 17 wherein said second maintenance connector is located below each of said first, second, third and fourth SF connectors.

21. The SF module according to claim 17 wherein said connector is located below said second maintenance connector.

22. In a midplane assembly that supports a combination of 1:1 system processor redundancy, 1:1 timing source redundancy, 1:1 high speed internal communication redundancy, and support for at least two N:1 redundant external interfaces, and comprises a plurality of front module slots on a first side of the assembly, and a plurality of corresponding rear module slots on a second side of the assembly, the front modules slots comprising a plurality of input/output (I/O) slots, a plurality of central processing unit (CPU)/Timing slots, a plurality of switching fabric (SF) slots, and a centrally located I/O slot; a first and second set of DC power pins for each of said front module slots for providing power thereto; for each CPU/Timing module slot, a set of pins for electrically connecting to a system clock, a set of pins for electrically connecting to a system synchronization signal, a set of pins to provide a common CPU I/O, and a set of pins to electrically connect one of said plurality of CPU/Timing slots to one of said plurality of SF slots, a CPU/Timing module for each of the CPU/Timing slots comprising:

- a first and a second DC power connector for receiving first and second set of DC power pins, respectively;
- a system clock connector that receives the set of system clock pins;
- a synchronization connector that receives the set of system synchronization pins;
- a CPU connector that receives the set of pins to provide a common CPU I/O; and
- a CPU/Timing connector that receives the set of pins to electrically connect one of said plurality of CPU/Timing slots to one of said plurality of SF slots.

23. The CPU/Timing module according to claim 22 wherein said system clock connector is located below each of said first and second DC power connectors.

24. The CPU/Timing module according to claim 22 wherein said synchronization connector is located below said system clock connector.

25. The CPU/Timing module according to claim 22 wherein said CPU connector is located below said synchronization connector.

26. The CPU/Timing module according to claim 22 wherein said CPU/Timing connector is located below said CPU connector.

* * * * *